(12) United States Patent
Okuyama et al.

(10) Patent No.: US 10,474,775 B2
(45) Date of Patent: Nov. 12, 2019

(54) METHOD AND SYSTEM FOR MODELING AN ELECTRONIC DEVICE UNDER TEST (DUT) USING A KERNEL METHOD

(71) Applicant: Keysight Technologies, Inc., Santa Rosa, CA (US)

(72) Inventors: Sho Okuyama, Kobe (JP); Junichi Iwai, Kobe (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 842 days.

(21) Appl. No.: 14/841,165

(22) Filed: Aug. 31, 2015

(65) Prior Publication Data

US 2017/0061045 A1    Mar. 2, 2017

(51) Int. Cl.
*G01R 31/28* (2006.01)
*G06F 17/50* (2006.01)

(52) U.S. Cl.
CPC ..... *G06F 17/5036* (2013.01); *G01R 31/2848* (2013.01)

(58) Field of Classification Search
CPC .................................................. G06F 17/5009
USPC .......................................................... 703/13
See application file for complete search history.

(56) References Cited

U.S. PATENT DOCUMENTS

| 6,775,646 B1 | 8/2004 | Tufillaro et al. |
| 2013/0166259 A1 | 6/2013 | Weber et al. |
| 2013/0191104 A1 | 7/2013 | Ceperic et al. |

OTHER PUBLICATIONS

Jan Verspecht et al., "Extension of X-parameters to Include Long-Term Dynamic Memory Effects", Microwave Symposium Digest, 2009. MTT '09. IEEE MTT-S International, 2009, pp. 741-744.
John Wood et al., "A Behavioral Modeling Approach to Nonlinear Model-Order Reduction for RF/Microwave ICs and Systems", IEEE Transactions on Microwave Theory and Techniques, vol. 52, No. 9, Sep. 2004, pp. 2274-2284.
Lee Barford et al., "Model-based test for analog integrated circuits", IMTC 2007—IEEE Instrumentation and Measurement Technology Conference Warsaw, Poland May 1-3, 2007, pp. 1-6.
D. Schreurs et al., "The Construction and Evaluation of Behavioral Models for Microwave Devices Based on Time-Domain Large-Signal Measurements", Electron Devices Meeting, 2000. IEDM '00. Technical Digest. International Year: 2000, pp. 819-822.

(Continued)

*Primary Examiner* — Saif A Alhija

(57) ABSTRACT

A method provides modeling a DUT and generating a simulated response. The method includes receiving a first portion of a stimulus signal generated by a signal generator, a second portion of the stimulus signal being input to the DUT; receiving a response signal output by the DUT in response to a second portion of the stimulus signal; digitizing the received first portion and the received response signal; correcting the digitized signals; measuring training input series data of the digitized first portion of the stimulus signal and training output series data of the digitized response signal; and utilizing kernel adaptive filtering for extracting a device model from the training input and output series data, and for generating simulated responses of the DUT to subsequent stimulus inputs, respectively. The kernel adaptive filtering may include a kernel least mean squares algorithm, a kernel Affine projection algorithm or a recursive least squares algorithm.

20 Claims, 4 Drawing Sheets

(56) References Cited

OTHER PUBLICATIONS

David E. Root et al., "Broad-Band Poly-Harmonic Distortion (PHD) Behavioral Models From Fast Automated Simulations and Large-Signal Vectorial Network Measurements", IEEE Transactions on Microwave Theory and Techniques, vol. 53, No. 11, November 2005, pp. 3656-3664.

J. Kim et al., "Digital predistortion of wideband signals based on power amplifier model with memory," Electronics Letters, Nov. 8, 2007, vol. 37, No. 23, pp. 1417-1418.

Weifeng Liu et al., "Kernel Adaptive Filtering—A Comprehensive Introduction," Adaptive and Learning Systems for Signal Processing, Communication, and Control, John Wiley & Sons, Inc., 2010, pp. 1-230.

J. Verspecht et al., "Polyharmonic Distortion Modeling," IEEE Microwave Magazine, Jun. 2006, pp. 44-57.

Luigi Carassale et al., "Modeling Nonlinear Systems by Volterra Series," Journal of Engineering Mechanics © ASC, Jun. 2010, pp. 801-818.

J. Kim et al., "Digital predistortion of wideband signals based on power amplifier model with memory," Electronics Letters, Nov. 8, 2001, vol. 37, No. 23, pp. 1417-1418.

Luigi Carassale et al., "Modeling Nonlinear Systems by Volterra Series," Journal of Engineering Mechanics © ASCE, Jun. 2010, pp. 801-818.

METHOD AND SYSTEM FOR MODELING AN ELECTRONIC DEVICE UNDER TEST (DUT) USING A KERNEL METHOD

BACKGROUND

Computer modeling of electronic devices provides a number of advantages, including efficient testing of designs, calibrating systems, determining and/or compensating for device characteristics, and determining output signals responsive to stimulus input. Accuracy of a device model is affected by factors such as nonlinearity and memory effect of the actual device under test (DUT). A DUT has memory effect if its response to a stimulus input depends on past values of the stimulus input. Examples of conventional models include a Volterra series model, a memory polynomial model, a memory-less polynomial model, and an X-parameter model.

The conventional models have various drawbacks.

Accordingly, a method and system of modeling a DUT is needed that is able to incorporate infinite order of nonlinearity (or at least higher order terms) with manageable computational complexity, as well as incorporate for memory effect.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1:
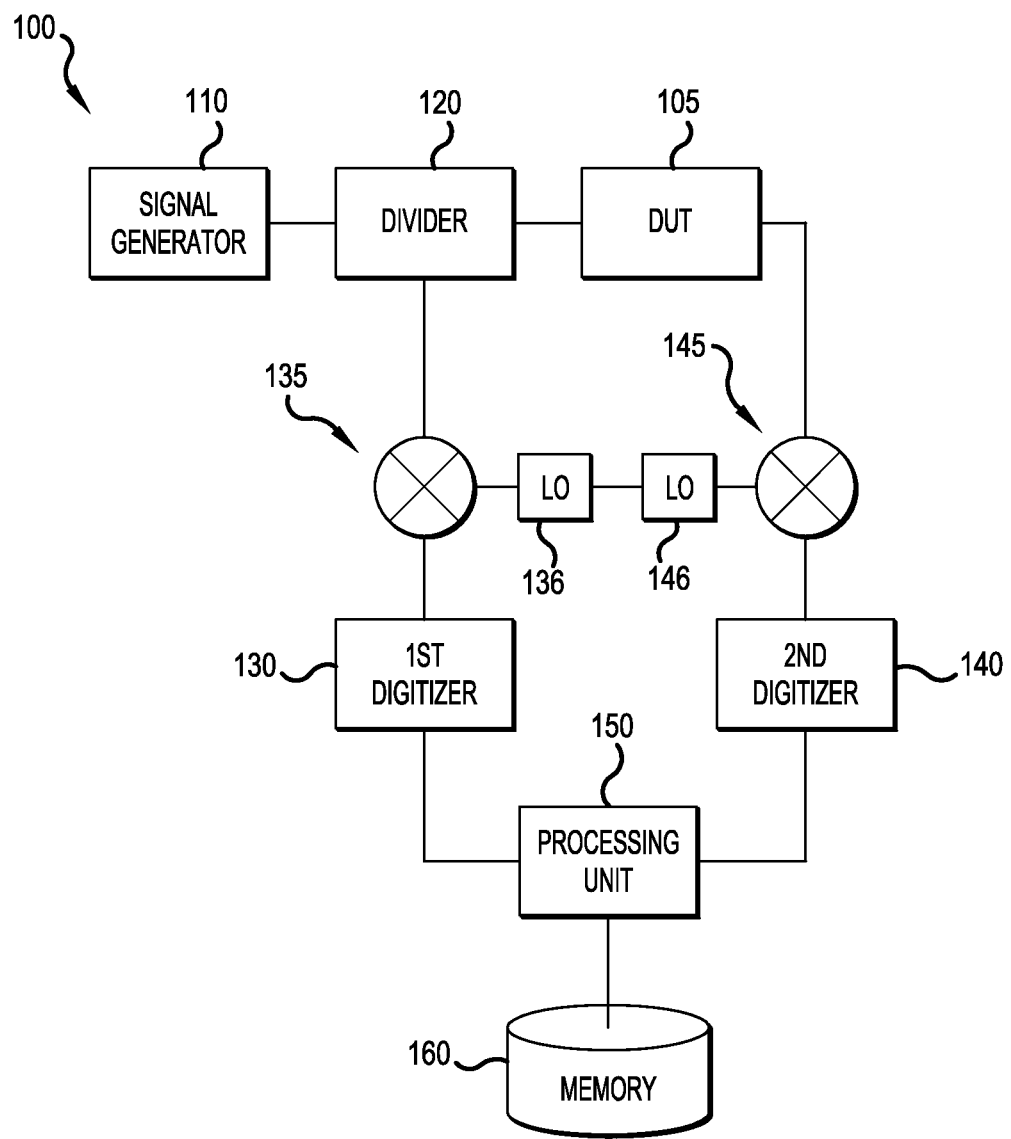
FIG. 1 is a simplified block diagram of a system for modeling a device under test (DUT) using a kernel adaptive filtering, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments generally provide a system and a method to model an electronic device under test (DUT), and to generate a simulated response of the electronic DUT in response to a stimulus input, using kernel adaptive filtering. The kernel adaptive filtering based model overcomes limitations on accuracy that conventional solutions have suffered. For example, the kernel adaptive filtering based model is able to model a DUT with nonlinearity of infinite order with moderate computational complexity because of what is called a "kernel trick." Also, the kernel adaptive filtering based model is able to incorporate and compensate for memory effect.

Generally, the kernel adaptive filtering based modeling requires synchronized time series data of a stimulus signal and a response signal output by the DUT in response to the stimulus signal. The stimulus signal may have high peak-to-average ratio in the time domain and a sufficiently wide bandwidth in the frequency domain, such as a quadrature modulated signal, for example. The stimulus and response signals may be directly sampled at RF frequency or sampled at IF frequency following down-conversion. The sampled data may be complex valued, although the kernel adaptive filtering may apply to scalar valued data, as well, without loss of generality.

FIG. 1 is a simplified block diagram of a system for modeling a DUT using kernel adaptive filtering, according to a representative embodiment.

Referring to FIG. 1, test system 100 is configured to model electronic DUT 105, which may have nonlinear characteristics and/or influenced by memory effect. For example, the DUT 105 may be a nonlinear power amplifier, mixer or transformer, although other types of nonlinear devices, as well as linear devices may be incorporated as the DUT 105. The test system 100 may be implemented, at least in part, by a vector signal analyzer (VSA) or a vector network analyzer (VNA), for example, although other types of test systems (or measuring devices) may be incorporated without departing from the scope of the present teachings.

In the depicted embodiment, the test system 100 includes a signal generator 110, a signal divider 120, a first digitizer 130, a second digitizer 140, a processing unit 150 and a memory 160. The signal generator 110 is configured to generate a stimulus signal to be input to the DUT 105, e.g., for testing purposes. The stimulus signal may be a radio frequency (RF) signal, for example. Also, the stimulus signal may be quadrature modulated, as in the case of an orthogonal frequency-division multiplexing (OFDM) signal, for example. In alternative embodiments, the signal generator 110 may be outside the test system 100, without departing from the scope of the present teachings.

The stimulus signal is received by the divider 120, which divides the stimulus signal into first and second portions. The first portion of the stimulus signal is directed toward the first digitizer 130, and the second portion of the stimulus signal is directed toward the DUT 105. The DUT 105 receives the second portion of the stimulus signal, and outputs a corresponding response signal. In alternative configurations, the divider 120 may be implemented by a power divider, a power splitter or a directional coupler, for example, without departing from the scope of the present teachings.

The test system 100 is shown as further including a first down-conversion mixer 135 and a second down-conversion mixer 145. The first down-conversion mixer 135 down-converts the RF frequency of the first portion of the stimulus signal to an intermediate frequency (IF), using a local oscillator (LO) 136, in the event a sampling rate of the first digitizer 130 is not fast enough to digitize the RF frequency of the stimulus signal. Likewise, the second down-conversion mixer 145 down-converts the RF frequency of the response signal to an IF, using LO 146, in the event the sampling rate of the second digitizer 140 is not fast enough to digitize the RF frequency of the response signal. Otherwise, given sufficient sampling rates of the first and second digitizers 130 and 140, the first and second down-conversion mixers 135 and 145 are not needed, and digitization is performed on the respective RF frequency signals. Although shown separately, it is understood that the LO 136 and the LO 146 may be implemented as a single LO that provides an LO frequency to both the first and second down-conversion mixers 135 and 145, without departing form the scope of the present teachings.

The first digitizer 130 digitizes the first portion of the stimulus signal to provide training input series data (which may be denoted x(n), as discussed below) to the processing unit 150, and the second digitizer 140 digitizes the response signal to provide training output series data (which may be denoted y(n), as discussed below) to the processing unit 150. In various embodiments, the training input series data and the training output series data may be time series stimulus data and time series response data, respectively. When the stimulus signal (and thus the response signal) is a quadrature modulated signal, for example, the measured training input series data and the measured training output series data are demodulated into corresponding complex values by the processing unit 150, for example. The processing unit 150 may store all or a portion of the training input series data and the training output series data in memory 160, for example.

The processing unit 150 is programmed and/or otherwise configured to implement the method of modeling the DUT 105 using kernel adaptive filtering, and subsequently generating simulated responses of the DUT 105 in response to subsequent stimulus inputs. The kernel adaptive filtering utilized by the processing unit 150 includes a kernel algorithm, such as a kernel recursive least squares (KRLS) algorithm, a kernel least mean squares (KLMS) algorithm or a kernel Affine projection algorithm, for example. Use of kernel adaptive filtering enables a model of the DUT 105 to be extracted from the training input series data and the training output series data. Once the model has been extracted (and stored in the memory 160), further use of the kernel adaptive filtering enables simulated responses of the DUT 105 to be generated in response to subsequent stimulus inputs, respectively. The stimulus inputs may be any type of actual or simulated stimuli, such as actual RF signals generated by a signal generator (e.g., the signal generator 110), or simulated RF signals provided by the processing unit 150 or other processor or signal source, for example. The kernel adaptive filtering is discussed in further detail with reference to FIG. 2, below.

As mentioned above, the processing unit 150 performs various steps of modeling the DUT 105 using kernel adaptive filtering, and subsequently generating simulated responses of the modeled DUT 105 in response to subsequent stimulus inputs. These functions may be performed, for example, by implementing instructions of a computer program stored in the memory 160. The processing unit 150 may also be configured to control additional overall operations of the test system 100, and may be included in the test system 100 (as shown) or may be a separate device, such as a personal computer (PC).

Generally, the processing unit 150 may be implemented by a computer processor (e.g., of a PC or dedicated workstation), application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions. In an embodiment, the computer processor may comprise a central processing unit (CPU), for example, executing an operating system. The processing unit 150 may include a storage device (e.g., memory 160), such as random access memory (RAM), read-only memory (ROM), flash memory, electrically programmable ROM (EPROM), electrically erasable programmable ROM (EEPROM), hard disk drive (HDD), or the like. Data from various measurements and modeling of the DUT 105 may be displayed on a display (not shown) and/or stored in the memory 180 for analysis, for example. A user input/output interface (not shown) may be included with the processing unit 150 for a user to control operations and/or view data and computation results of the test system 100.

Figure 2:
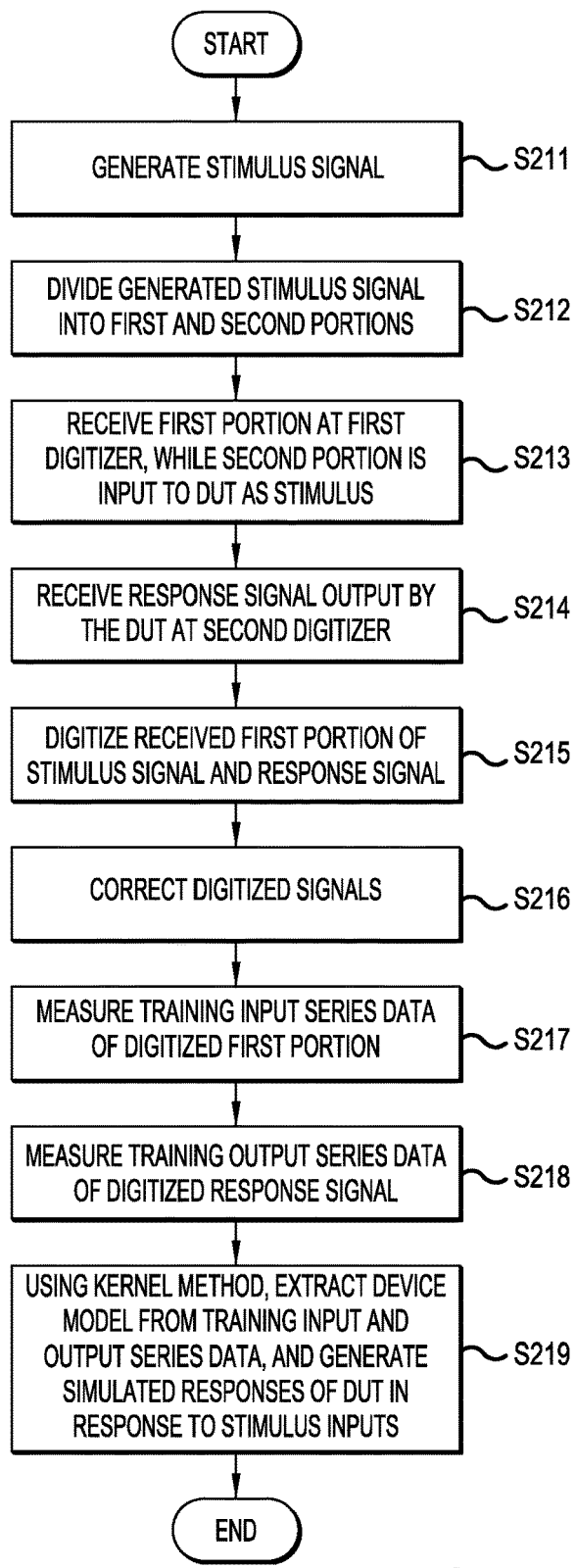
FIG. 2 is a flow diagram showing a method for modeling a DUT and generating a simulated response of the DUT using a kernel adaptive filtering, according to a representative embodiment.

FIG. 2 is a flow diagram showing a method for modeling an electronic DUT and generating a simulated response of the electronic DUT using kernel adaptive filtering, according to a representative embodiment. All or a portion of the steps depicted in FIG. 2 may be executed by or under control of the processing unit 150.

Referring to FIG. 2, the method includes generating a stimulus signal in block S211, and dividing the generated stimulus signal into first and second portions in block S212. The stimulus signal may be an RF signal generated by signal generator 110, and in various embodiments, may be a quadrature modulated signal. In block S213, the first portion of the stimulus signal is received by first digitizer 130, and a second portion of the stimulus signal is input to the DUT 105 as stimulus. The first portion of the stimulus signal may be received either directly as an RF signal, or after being down-converted to an IF by first down-conversion mixer 135, as discussed above. In block S214, a response signal, output by the DUT 105 in response to the second portion of the stimulus signal, is received by second digitizer 140. The response signal may be received either directly as an RF signal, or after being down-converted to an IF by second down-conversion mixer 145, as discussed above. The received first portion of the stimulus signal and the received response signal are digitized in block S215 by the first and second digitizers 130 and 140, respectively.

In block S216, the digitized first portion of the stimulus signal and the digitized response signal are corrected to remove effects of the measurement system and to reproduce actual input and output signals of the DUT 105. In an embodiment, the divider 120, the down-conversion mixers 135 and 145, and the transmission channels between them are characterized by S-parameters with which effects of the components are de-embedded from the digitized first portion of the stimulus signal and the digitized response signal. After correction, training input series data of the digitized first portion of the stimulus signal are measured in block S217, and training output series data of the digitized response signal are measured in block S218.

In block S219, kernel adaptive filtering is utilized for extracting a device model from the training input series data and the training output series data, and for generating simulated responses of the DUT 105 in response to subsequent stimulus inputs, respectively. In various embodiments, the kernel adaptive filtering includes use of a kernel adaptive filtering algorithm, such as a kernel least mean squares (KLMS) algorithm, a kernel Affine projection algorithm or a kernel recursive least squares (KRLS) algorithm, for example.

In various embodiments, the measured training input series data, denoted x(n), and training output series data, denoted y(n), may be formatted for processing by the kernel adaptive filtering. The training input series data (x(n)) and training output series data (y(n)) (where n is a positive integer equal to 1, 2, 3 ... N) are formatted to pairs of a training input vector u(n) and a training output scalar d(n), according to Equations (1) and (2):

$$u(n) = [x(n+K-1), \ldots, x(n)]^T \quad (1)$$

$$d(n) = y(n+K-1) \quad (2)$$

In Equations (1) and (2), K represents the length of the memory effect of DUT 105, which is a free parameter and determined later. At least one kernel function is determined to define an inner product of two input vectors (u(n)), where each input vector (u(n)) comprises a subsequence extracted from either of the measured training input series data (x(n)) or the stimulus inputs. This is done for scalar valued data, as well as for complex valued data. The kernel function defines the inner product of two different input vectors and plays a central role in the kernel adaptive filtering. The value given by the kernel function may be viewed as a quantifier of the resemblance of the two training input vectors. The kernel function may include one of a Gaussian kernel function, a polynomial kernel function, or a Bergman kernel function, for example, although other kernel functions may be incorporated without departing from the scope of the present teachings.

In the example below a Gaussian kernel function and a polynomial kernel function are used, where the kernel functions are provided by Equations (3) and (4), respectively:

Gaussian Kernel: $\exp(\alpha |u(i) - u(j)|^2) \quad (3)$

Polynomial Kernel: $(1 + \Re(u(t))^T \Re(u(j)) + \Im(u(i))^T \Im(u(j)))^\beta \quad (4)$ In Equation (4), in particular, $\Re(\cdot)$ is an operator to extract a vector consisting of the real part of the input vector u(n) and $\Im(\cdot)$ is an operator to extract a vector consisting of the imaginary part of the input vector u(n), respectively. The kernel parameters $\alpha$ and $\beta$ are determined subsequently. For purposes of illustration, the kernel adaptive filtering algorithm is the KRLS algorithm, and the kernel function will simply be denoted by <u(i), u(j)> in the following discussion. Alternative kernel adaptive filtering algorithms, such as the kernel least mean squares (KLMS) algorithm and the kernel Affine projection algorithm, may be incorporated without departing from the scope of the present teachings. Initialization of the KRLS algorithm is indicated by Equation (5), below, where $\lambda$ is a regularization parameter, which is determined later. After initialization, various vectors and scalars are iterated for i>1, where vector h(i), vector z(i), scalar r(i), scalar Q(i), scalar e(i), and vector a(i) are temporary variables to accommodate the computations, as would be apparent to one of ordinary skill in the art. The computations are indicated generally below by Equations (6) to (11):

$$Q(1) = (\lambda + \langle u(1), u(1) \rangle)^{-1}, \quad (5)$$
$$a(1) = Q(1)d(1)$$

$$h(i) = [\langle u(1), u(i) \rangle, \ldots, \langle u(i-1), u(i) \rangle]^\dagger \quad (6)$$

$$z(i) = Q(i-1)h(i) \quad (7)$$

$$r(i) = \lambda + \langle u(i)u(i) \rangle - z(i)^\dagger h(i) \quad (8)$$

$$Q(i) = r(i)^{-1} \begin{bmatrix} Q(i-1)r(i) + z(i)z(i)^\dagger & -z(i) \\ -z(i)^\dagger & 1 \end{bmatrix} \quad (9)$$

$$e(i) = d(i) - h(i)^\dagger a(i-1) \quad (10)$$

$$a(i) = \begin{bmatrix} a(i-1) - z(i)r(i)^{-1}e(i) \\ r(i)^{-1}e(i) \end{bmatrix} \quad (11)$$

A set of training input vectors u(1), u(2), ..., u(M) and a(M) serves as a device model. The training input vector u(i) may be referred to as "dictionary," and the training input vector a(M) may be referred to as "coefficient vector," respectively.

Once a device model is extracted using the foregoing computations using the kernel functions, the kernel adaptive filtering proceeds to provide a simulated response of the DUT 105 in response to desired stimulus inputs. The stimulus inputs may include actual RF signals generated by a signal generator (e.g., signal generator 110), simulated RF signals provided by a processor (e.g., processing unit 150), or any other compatible stimuli. Initially, the stimulus input may be denoted x'(n), and formatted in the same manner as described above for extraction of the device model, and the simulated response may be denoted y'(n). The stimulus input data (x'(n)) and simulated response data (y'(ii)) (where n is a positive integer equal to 1, 2, 3 ... N) are formatted to pairs of an input vector u'(n) and an estimated simulated output scalar y'(n), according to Equations (12) and (13):

$$u'(n) = [x'(n+K-1), \ldots, x'(n)]^T \quad (12)$$

$$y'(n) = [\langle u(1), u'(i) \rangle, \ldots, \langle u(M), u'(i) \rangle] a(M) \quad (13)$$

The free parameters of the device model, such as the memory effect parameter K, the kernel parameter $\alpha$ or $\beta$, and regularization parameter $\lambda$, have an impact on the device model accuracy. Although the free parameters should be determined by physical characteristics of the DUT 105, the best parameters may be unknown. Therefore it is useful to optimize the parameters automatically.

In an embodiment, the free parameters are optimized by evaluating the accuracy of the device model with another pair of stimulus-response measurement data different than the data for device model extraction. In various embodiments, line search may be used, for example, although other optimization techniques may be incorporated without departing from the scope of the present teachings. The line search is iterative, and begins with temporary free parameters, which are the smallest possible values for the free parameters. A temporary device model is extracted with the temporary free parameters, and a response is estimated for the evaluation stimulus by the model. An error is calculated by comparing the estimated response with the evaluation response data. This error calculation is repeated while incrementally increasing one of the free parameters by a fixed step until the error reaches a minimum. Once the minimum is found for that free parameter, it is fixed, and the method is repeated for the next free parameter by incrementally increase the next free parameter in the same manner. The iterative process continues until the errors of each of the free parameters no longer decrease.

In the kernel adaptive filtering of model extraction using a KRLS algorithm, for example, an input vector u(n) may resemble one in the existing input vector dictionary, denoted by input vector u(i). When the actual scalar response d(n) also resembles the estimated scalar response d'(n) that is calculated by the existing input vector dictionary and coefficient vector, the data is uninformative and can be discarded. To this end, two thresholds are set to judge whether or not subsequently determined new data is worth adding to the dictionary. A new input vector is added when |u(n)−u(i)| is greater than an input threshold for every input vector u(i) in the existing dictionary or when |d(n)−d'(n)| is greater than an output threshold. In an embodiment, the input and output thresholds are adjusted by the user according to desired model accuracy.

Figure 3:
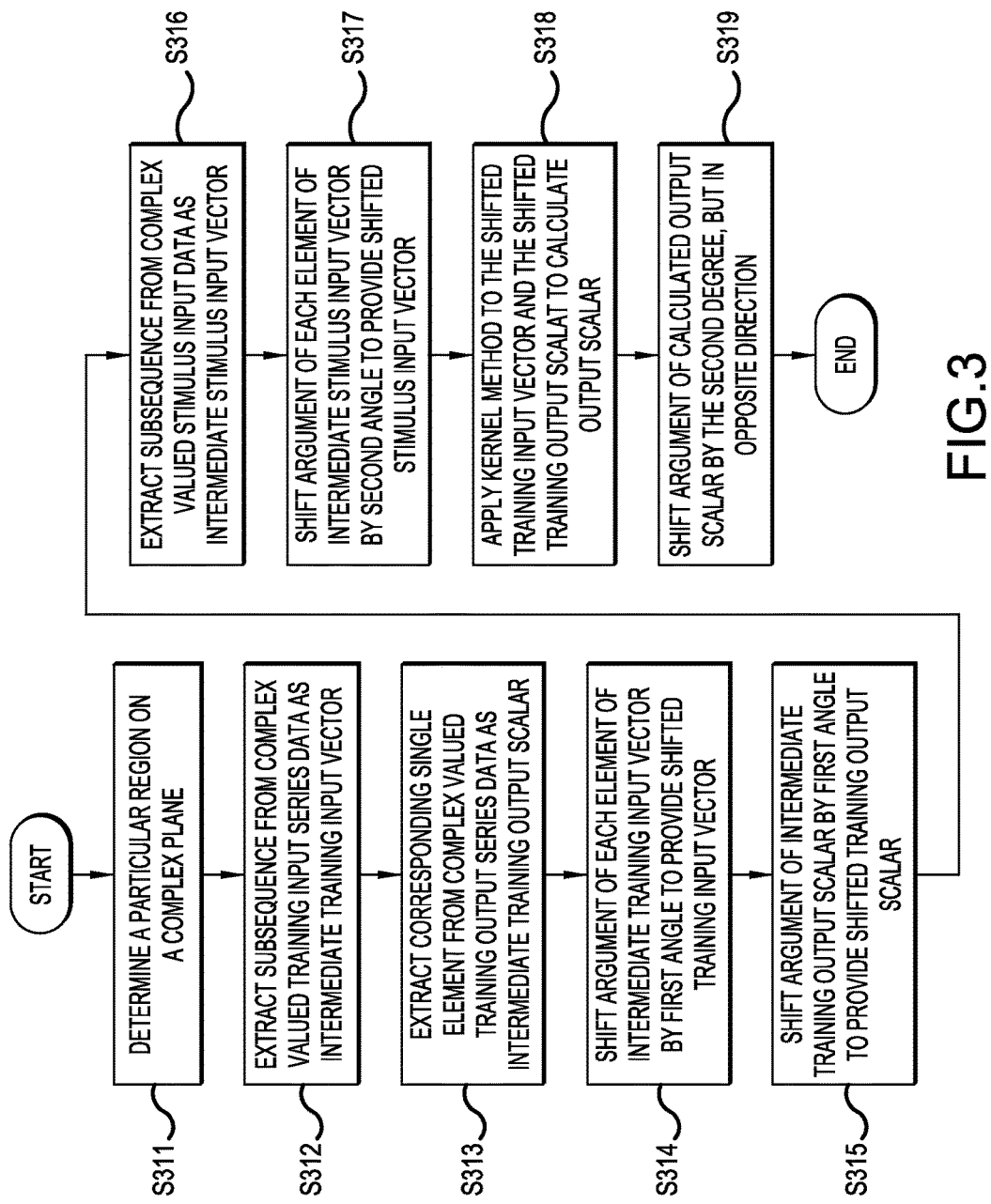
FIG. 3 is a flow diagram showing a method for modeling a DUT and generating a simulated response of the DUT using a kernel adaptive filtering, according to a representative embodiment, in which convergence of the kernel adaptive filtering is accelerated for complex valued data.

FIG. 3 is a flow diagram showing a method for modeling an electronic DUT and generating a simulated response of the electronic DUT using kernel adaptive filtering, according to a representative embodiment, in which convergence of the kernel adaptive filtering is accelerated for complex valued data. As mentioned above, the kernel adaptive filtering may comprise an KRLS algorithm, an KLMS algorithm or a kernel Affine projection algorithm, for example, although the embodiment described below assumes use of the KRLS algorithm for purposes of illustration. All or a portion of the steps depicted in FIG. 3 may be executed by or under control of the processing unit 150.

Referring to FIG. 3, the method of accelerating convergence is essentially incorporated into block S219 (after the training input series data and the training output series data have been measured in blocks S217 and S218, respectively, which are complex valued data resulting from quadrature demodulation, for example. Accordingly, the depicted method includes extracting a device module from the training input series data and the output training series data, and subsequently generating simulated responses of the DUT 105 in response to subsequently provided stimulus inputs, as described above, except with the additional benefit of accelerated convergence.

Initially, a particular region on a complex plane is determined in block S311. The particular region is generally a region surrounding a half line having an initial point that is the origin of the complex plane, where the half line is specified by an angle between the half line and the real axis.

In block S312, a subsequence is extracted from the training input series data, which is complex valued in this case, as an intermediate training input vector. In block S313, corresponding single element is extracted from the training output series data, which likewise is complex valued, as an intermediate training output scalar. An argument of each element of the intermediate training input vector is shifted by a first angle to provide a shifted training input vector in block S314, and an argument of the intermediate training output scalar is likewise shifted by the first angle to provide a shifted training output scalar in block S315. Accordingly, trajectories drawn by the shifted training input vector congregate around the particular region on the complex plane.

In block S316, a subsequence is extracted from complex valued stimulus input data as an intermediate stimulus input vector. An argument of each element of the intermediate stimulus input vector is shifted by a second angle in block S317 to provide a shifted stimulus input vector. Accordingly, trajectories drawn by the shifted stimulus input vector congregate around the particular region on the complex plane. In block S318, the kernel adaptive filtering is applied to the shifted training input vector and the shifted training output scalar to calculate an output scalar corresponding to the shifted stimulus input vector provided in block S317.

An argument of the calculated output scalar corresponding to the shifted stimulus input vector is shifted in block S319 by the second degree, but in an opposite direction of the shifting of the argument of each element of the intermediate stimulus input vector, to provide a shifted output scalar. Generally, the process consists of two repeating loops. One loop includes blocks S312 to S317 for extracting model parameters, and another loop includes blocks S318 to S319 to generate simulated responses. The simulated response of the electronic DUT 105 is ultimately generated in response to a series of the shifted output scalars of block S319.

As mentioned above, the measured training input series data x(n) and the measured training output series data y(n) (where n is a positive integer equal to 1, 2, 3 . . . N) are formatted to pairs of a training input vector u(n) and a training output scalar d(n). However, according to the method depicted in FIG. 3, for example, in which the convergence of the kernel adaptive filtering for the complex valued training input series data x(n) and training output series data y(n) is accelerated, shifting terms must be included, examples of which are shown in Equations (14) and (15):

$$u(n)=\exp(-j\theta(n))*[x(n+K-1), \ldots, x(n)]^T \qquad (14)$$

$$d(n)=\exp(-j\theta(n))*y(n+K-1) \qquad (15)$$

In Equations (14) and (15), K represents the length of the memory effect of DUT 105, and θ(n) is the argument of x(n). The term exp(−jθ(n)) is introduced so that the trajectory drawn by the training input u(n) congregates around the real axis in the complex plane. This term accelerates convergence of the KRLS algorithm, for example.

As discussed above, at least one kernel function is determined to define an inner product of two input vectors (u(n)), where each input vector (u(n)) comprises a subsequence extracted from either of the measured training input series data (x(n)) for building the device model or the stimulus inputs for simulating performance of the device model. The kernel function defines the inner product of two different input vectors and plays a central role in the kernel adaptive filtering. The value given by the kernel function may be viewed as a quantifier of the resemblance of the two training input vectors. The kernel function may include one of a Gaussian kernel function, a polynomial kernel function, or a Bergman kernel function, for example, although other kernel functions may be incorporated without departing from the scope of the present teachings.

In the example below a Gaussian kernel function and a polynomial kernel function are used, where the kernel functions are provided by Equations (3) and (4), respectively, above. In Equation (4), in particular, $\Re(\cdot)$ is an operator to extract a vector consisting of the real part of the vector u(n) and $\Im(\cdot)$ is an operator to extract a vector consisting of the imaginary part of the vector u(n), respectively. The kernel parameters α and β are determined subsequently. For purposes of illustration, the kernel adaptive filtering comprises the KRLS algorithm, and the kernel function will simply be denoted by <u(i), u(j)> in the following discussion. Initialization of the KRLS algorithm is indicated by Equation (5), and the ensuing computations are indicated generally by Equations (6) to (11), discussed above.

A set of training input vectors u(1), u(2), . . . , u(M) and a(M) serves as a device model. The training input vector u(i) may be referred to as "dictionary," and the training input vector a(M) may be referred to as "coefficient vector," respectively.

Once the device model is extracted using the foregoing computations using the kernel functions, the kernel adaptive filtering proceeds to provide a simulated response of the DUT 105 in response to desired stimulus inputs. The stimulus inputs may include actual RF signals generated by a signal generator (e.g., signal generator 110), simulated RF signals provided by a processor (e.g., processing unit 150), or any other compatible stimuli. Initially, the stimulus input may be denoted x'(n), and formatted in the same manner as described above for extraction of the device model, and the simulated response may be denoted y'(n). The stimulus input data (x'(n)) and simulated response data (y'(n)) (where n is a positive integer equal to 1, 2, 3 . . . N) are formatted to pairs of an input vector u'(n) and an estimated simulated output scalar y'(n), according to Equations (16) and (17):

$$u'(n)=\exp(-j\theta'(n))*[x'(n+K-1), \ldots, x'(n)]^T \quad (16)$$

$$y'(n)=\exp(j\theta'(n))*[(u(1),u'(i)), \ldots, (u(M),u'(i))]a(M) \quad (17)$$

The term exp(jθ'(n)) is needed in Equation (17) to compensate for exp(−θ'(n)) in Equations (16), above.

Again, the free parameters of the device model, such as the memory effect parameter K, the kernel parameter α or β, and regularization parameter λ, have an impact on the device model accuracy. Although the free parameters should be determined by physical characteristics of the DUT 105, the best parameters may be unknown. Therefore it is useful to optimize the parameters automatically, for example, using a line search, as described above.

Figure 4:
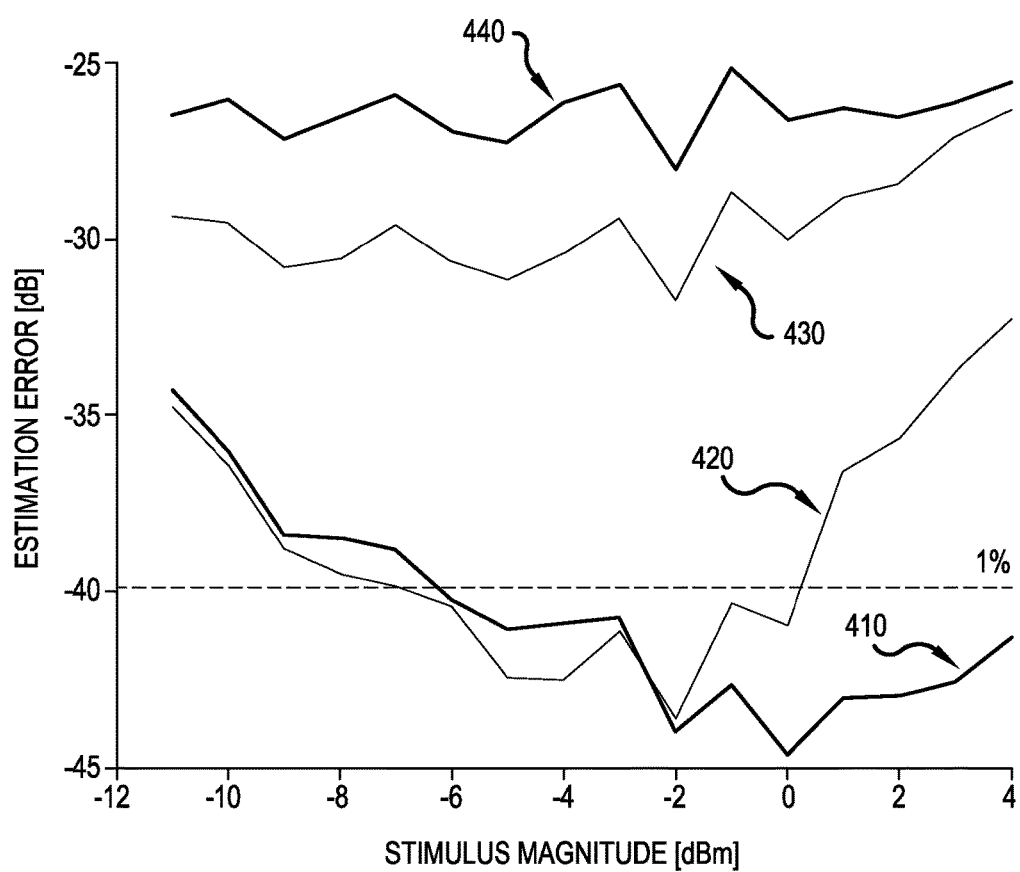
FIG. 4 shows traces corresponding to estimation errors as a function of stimulus input magnitude for conventional modeling as compared to kernel adaptive filtering based modeling, according to a representative embodiment.

FIG. 4 shows traces corresponding to estimation errors as a function of stimulus input magnitude for conventional modeling as compared to kernel adaptive filtering modeling, according to a representative embodiment. Generally, the lower the estimation error (indicated in decibels (dB)), as a function of stimulus input magnitude (indicated in dBm), the more accurate the modeling method.

Referring to FIG. 4, trace 410 indicates the kernel modeling method according to a representative embodiment. For purposes of comparison, trace 420 indicates a conventional memory polynomial modeling method, trace 430 indicates a conventional X-parameter modeling method, and trace 440 indicates a conventional memory-less polynomial method.

As shown, the kernel modeling method according to a representative embodiment (trace 410) clearly provides the lowest estimation error at all stimulus input magnitudes as compared to the conventional X-parameter modeling method (trace 430) and the memory-less polynomial modeling method (trace 440). With regard to the memory polynomial modeling method (trace 420), the kernel modeling method (trace 410) provides approximately the same estimation error at lower stimulus input magnitudes, e.g., less than about −2.0 dBm, but the kernel modeling method (trace 410) clearly provides the lowest estimation error at the higher magnitudes of stimulus inputs. Also, the difference between the kernel modeling method (trace 410) polynomial modeling method (trace 420) becomes even greater as the stimulus input magnitudes further increase, e.g., beyond about −2.0 dBm.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed:

1. A method of modeling an electronic device under test (DUT) and generating a simulated response of the electronic DUT, the method comprising:
   receiving a first portion of a stimulus signal generated by a signal generator, a second portion of the stimulus signal being input to the electronic DUT;
   receiving a response signal output by the electronic DUT in response to the second portion of the stimulus signal;
   digitizing the received first portion of the stimulus signal and the received response signal;
   correcting the digitized first portion of the stimulus signal and the digitized response signal;
   measuring training input series data of the digitized first portion of the stimulus signal;
   measuring training output series data of the digitized response signal; and
   utilizing kernel adaptive filtering (i) for extracting a device model from the training input series data and the training output series data, and (ii) for generating simulated responses of the electronic DUT in response to subsequent stimulus inputs, respectively.

2. The method of claim 1, wherein the electronic DUT comprises a nonlinear electronic device.

3. The method of claim 1, wherein the stimulus signal is generated by a signal generator.

4. The method of claim 3, further comprising:
   dividing the stimulus signal into the first portion of the stimulus signal and the second portion of the stimulus signal using one of a power divider, a power splitter or a directional coupler,
   wherein the first portion of the stimulus signal is received from the power divider, the power splitter or the directional coupler.

5. The method of claim 1, further comprising:
   down-converting a stimulus carrier frequency of the first portion of the stimulus signal and a response carrier frequency of the response signal prior to the digitizing, when digitizers configured to perform the digitizing are not fast enough to digitize the stimulus carrier frequency of the received first portion of the stimulus signal and the response carrier frequency of the received response signal.

6. The method of claim 1, wherein the stimulus signal is quadrature modulated, the method further comprising:
   demodulating the measured training input series data and the measured training output series data into corresponding complex values.

7. The method of claim 1, wherein utilizing the kernel adaptive filtering comprises:

determining at least one kernel function to define an inner product of two input vectors, wherein each input vector comprises a subsequence extracted from either of the measured training input series data or the stimulus inputs.

8. The method of claim 7, wherein the at least one kernel function comprises one of a Gaussian kernel function, a polynomial kernel function, or a Bergman kernel function.

9. The method of claim 1, wherein the kernel adaptive filtering comprises one of a kernel least mean squares (KLMS) algorithm, a kernel Affine projection algorithm, or a kernel recursive least squares (KRLS) algorithm.

10. The method of claim 1, wherein the stimulus inputs comprise radio frequency (RF) signals generated by a signal generator.

11. The method of claim 1, wherein the stimulus inputs are simulated RF signals provided by a processor.

12. The method of claim 1, wherein the training input series data comprise time series stimulus data, and the training output series data comprises time series response data.

13. A method of accelerating convergence of a kernel adaptive filtering for complex valued data used for modeling an electronic device under test (DUT) to generate a simulated response of the electronic DUT, the method comprising:

determining a particular region on a complex plane;

extracting a subsequence from complex valued training input series data as an intermediate training input vector, and extracting a corresponding single element from complex valued training output series data as an intermediate training output scalar;

shifting an argument of each element of the intermediate training input vector by a first angle to provide a shifted training input vector, and shifting an argument of the intermediate training output scalar by the first angle to provide a shifted training output scalar, so that trajectories drawn by the shifted training input vector congregate around the particular region on the complex plane;

extracting a subsequence from complex valued stimulus input data as an intermediate stimulus input vector;

shifting an argument of each element of the intermediate stimulus input vector by a second angle to provide a shifted stimulus input vector, so that trajectories drawn by the shifted stimulus input vector congregate around the particular region on the complex plane;

applying the kernel adaptive filtering to the shifted training input vector and the shifted training output scalar to calculate an output scalar corresponding to the shifted stimulus input vector; and shifting an argument of the calculated output scalar corresponding to the shifted stimulus input vector by the second degree, but in an opposite direction of the shifting of the argument of each element of the intermediate stimulus input vector, to provide a shifted output scalar.

14. The method of claim 13, wherein the complex valued training input series data comprise time series data, and the complex valued training output series data comprise time series data.

15. A test system for modeling an electronic device under test (DUT) and generating a simulated response of the electronic DUT, the test system comprising:

a signal generator configured to generate a stimulus signal;

a divider configured divide the stimulus signal into a first portion and a second portion, the second portion of the stimulus signal being input to the electronic DUT;

a first digitizer configured to receive and digitize the first portion of the stimulus signal;

a second digitizer configured to receive and digitize a response signal output by the electronic DUT in response to the second portion of the stimulus signal; and a processing unit programmed to correct the digitized first portion of the stimulus signal and the digitized response signal, to measure training input series data of the digitized first portion of the stimulus signal and training output series data of the digitized response signal, and to utilize kernel adaptive filtering (i) to extract a device model from the training input series data and the training output series data, and (ii) to generate simulated responses of the electronic DUT in response to subsequent stimulus inputs, respectively.

16. The test system of claim 15, further comprising:

a first down-conversion mixer configured to down-convert a frequency of the first portion of the stimulus signal to a first intermediate frequency (IF) before the first portion of the stimulus signal is received by the first digitizer; and a second down-conversion mixer configured to down-convert a frequency of the response signal to a second IF before the response signal is received by the second digitizer.

17. The test system of claim 15, wherein the divider comprises one of a power divider, a power splitter or a directional coupler.

18. The test system of claim 15, wherein the training input series data comprises time series stimulus data, and the training output series data comprises time series response data.

19. The test system of claim 15, wherein the stimulus signal is quadrature modulated, and the training input series data and the training output series data are complex valued.

20. The test system of claim 15, wherein the kernel adaptive filtering comprises one of a kernel least mean squares (KLMS) algorithm, a kernel Affine projection algorithm, or a kernel recursive least squares (KRLS) algorithm.

* * * * *

UNITED STATES PATENT AND TRADEMARK OFFICE
CERTIFICATE OF CORRECTION

PATENT NO. : 10,474,775 B2
APPLICATION NO. : 14/841165
DATED : November 12, 2019
INVENTOR(S) : Sho Okuyama et al.

Page 1 of 1

It is certified that error appears in the above-identified patent and that said Letters Patent is hereby corrected as shown below:

In the Claims

In Column 11, Line 55, in Claim 13, delete "degree," and insert -- angle, --, therefor.

Signed and Sealed this
Thirty-first Day of March, 2020

Andrei Iancu
*Director of the United States Patent and Trademark Office*